United States Patent [19]
Gagniere

[11] 3,943,338
[45] Mar. 9, 1976

[54] ELECTRIC DEVICE FOR NUMERICAL MEASUREMENT OF A MAGNITUDE BY A PULSE COUNTER

[75] Inventor: Claude Gagniere, Paris, France
[73] Assignee: Charbonnages de France, Paris, France
[22] Filed: Sept. 12, 1972
[21] Appl. No.: 288,397

[30] Foreign Application Priority Data
Sept. 14, 1971 France............................ 71.33067

[52] U.S. Cl. ........ 235/92 PL; 235/92 EV; 235/92 R
[51] Int. Cl.² ........................................ G06M 3/14
[58] Field of Search..................... 235/92 PL, 92 EV

[56] References Cited
UNITED STATES PATENTS
3,209,130   9/1965   Schmidt ......................... 235/92 PL
3,349,390  10/1967   Glassman ....................... 235/92 PL
3,549,870  12/1970   Lay ............................... 235/92 PL
3,719,807   3/1973   Daley ............................ 235/92 PL Primary Examiner—Joseph M. Thesz, Jr.
Attorney, Agent, or Firm—Karl W. Flocks

[57] ABSTRACT

An electronic counting device for displaying the measurement of a quantity includes a pulse counter which receives a supplementary pulse every time the pulse counter stands at any one of a predetermined series of numerals. The natural counting base of the counter is thus effectively modified so that the displayed output is determined according to a different counting base.

5 Claims, 3 Drawing Figures

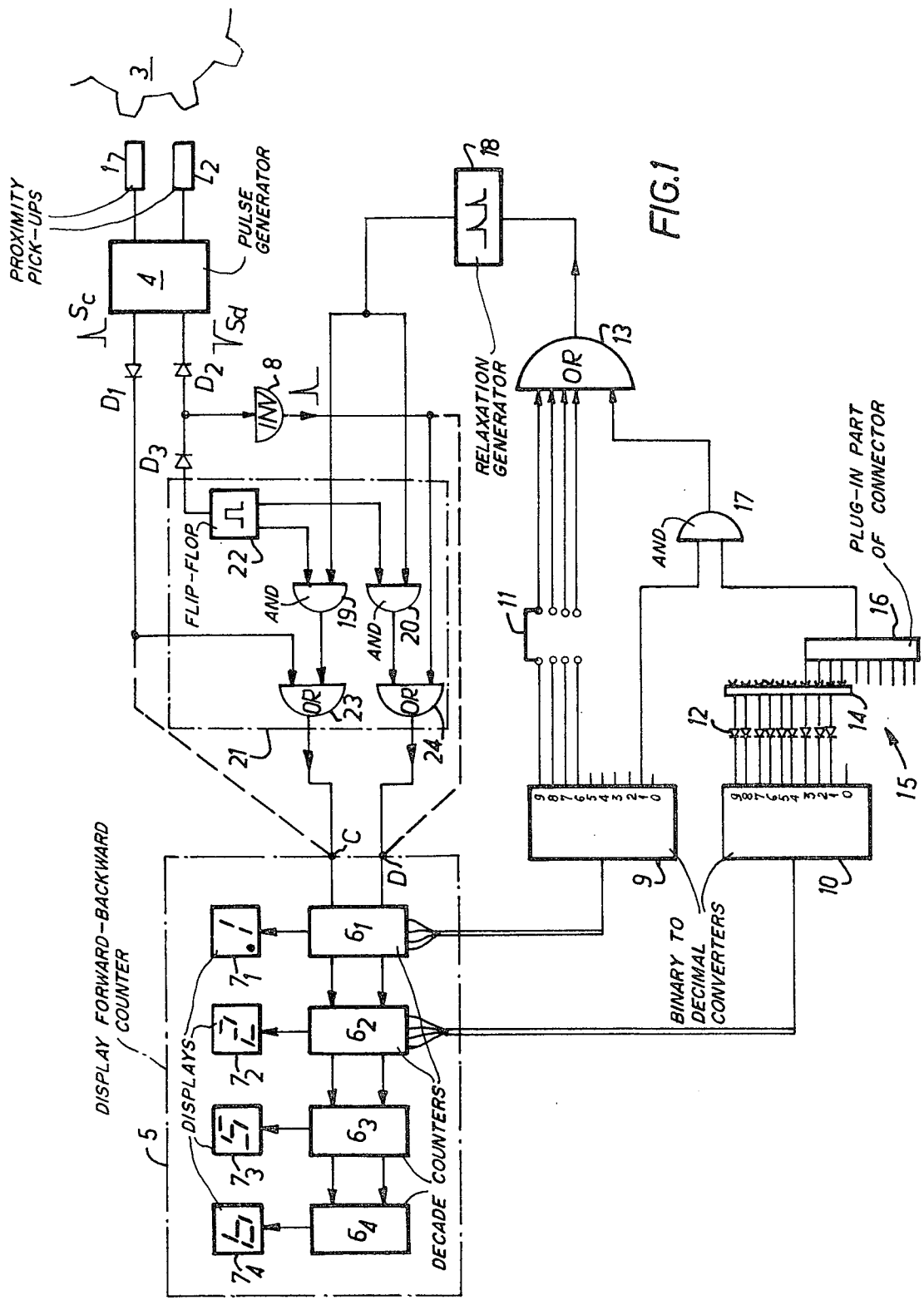

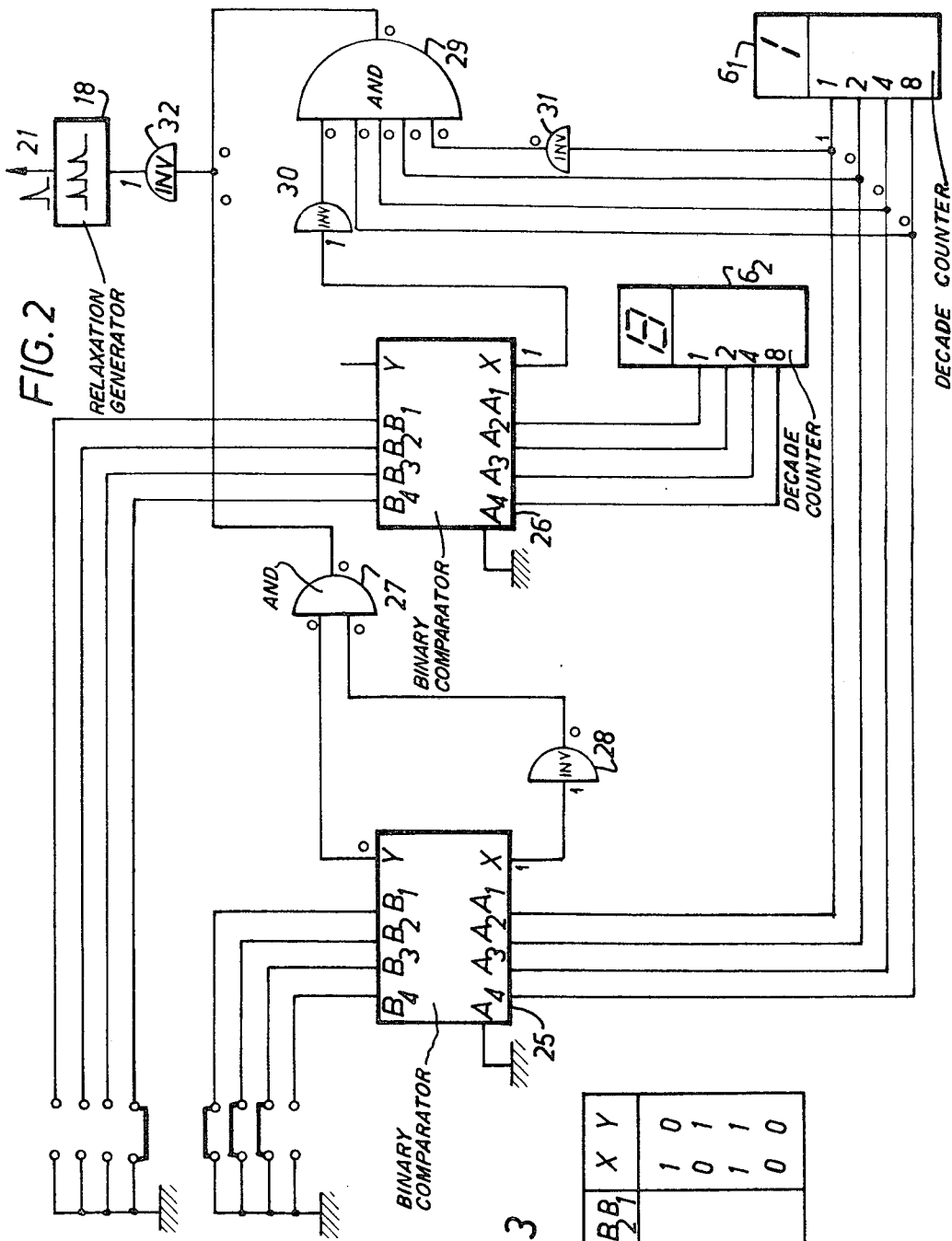

ELECTRIC DEVICE FOR NUMERICAL MEASUREMENT OF A MAGNITUDE BY A PULSE COUNTER

BACKGROUND OF THE INVENTION

1. Field of the Invention

The invention relates to improved electrical devices for numerical measurement and display of the value of a quantity, variations of which are represented by a series of electric pulses, each of which corresponds to an increment of a rational fraction of the unit of measurement of said quantity.

2. Description of the Prior Art

Counter units are known which display the number of pulses counted from the start of counting in decimal notation (counting base equal to 10) or in binary notation (counting base equal to $2^n$). These counting units utilize counting circuits connected in cascade.

Some of these units comprise a series of decade counters connected in cascade. Others utilise counting circuits each of which is capable of counting $2^n$ pulses before supplying a pulse to the counting circuit next following and being returned to zero.

These units are designed so that a new pulse will correspond to a fraction of the measuring unit equal to the reciprocal of the counting base. If in fact $b$ is the counting base and if the unit increase of the magnitude represented by the appearance of a pulse is equal to the fraction $1/b$ of the measuring unit, each counting circuit is returned to zero and supplies a pulse to the circuit immediately following it when it has counted $b$ pulses.

It may happen that the unitary increment of the quantity to be measured and displayed is smaller than the reciprocal of the counting base. In this case means are known for arranging the counting circuits so that they will have an artifical base smaller than their natural counting base. These means generally consist in suitably modified counting circuits themselves. Thus, certain types of numerical display electric clocks are made in which the artificial counting bases may be 12, 24 or 60.

With known arrangements, however, it is possible to obtain only whole artificial counting bases and such arrangements cannot therefore be adapted to the measurement and display of the value of a quantity the unitary increment of which is a whole fraction of the measuring unit. Furthermore, known arrangements are not designed to enable the user to modify the artificial counting bases.

SUMMARY

The invention provides an electrical device for the numerical measurement of a quantity by a pulse counter with a whole number fixed natural counting base, in which each pulse may represent any rational fraction of the measuring unit of the quantity. The invention makes available to the user easy means of modifying the artificial counting base. This facility opens up new fields of industrial applications to the technique of numerical counting by means of pulses.

A device according to the invention may comprise in addition means for supplying and recording an additional pulse every time the pulse counter has recorded one of the numbers of a predetermined series.

BRIEF DESCRIPTION OF THE DRAWINGS

FIG. 1 is a schematic circuit diagram of an electrical measurement device according to the invention;

FIG. 2 is a partial schematic diagram of a modified embodiment of the invention, and FIG. 3 is a table setting out part of the logic used in the device shown in FIG. 2.

FIG. 1 illustrates a device according to the invention, which is for example applicable to the monitoring and control of the progression of an ore extraction machine guided by a rigid conveyor and hauled along a cutting face in a reciprocating movement by means of a chain meshing with a sprocket.

Pulses $Sc$ and $Sd$ specific to the direction of progression of the machine are generated by an element composed of two proximity pick-ups 1 and 2 placed in a disengaging finger near the circumference of a sprocket 3 meshing with a hauling chain, the pick-ups being so disposed that they are separated by a distance which at the most is equal to the width of one tooth of the sprocket 3. These pick-ups detect the passage in front of them of the teeth of the sprocket 3 and, in a manner known per se, a pulse generator 4 synchronised by the pick-ups 1 and 2 supplies pulses $Sc$ and $Sd$ the polarity of which represents the direction of progression of the machine, the positive pulses $Sc$ corresponding for example to the forward travel of the machine and the negative pulses $Sd$ to the reverse travel of the machine.

The reference 5 designates a display forward-backward counter composed of a series of decade counters $6_1$ to $6_4$ connected in cascade, each of them being connected to a display $7_1 - 7_4$. This forward-backward counter assembly has a forward counting input C and a backward counting input D. Depending on the type of decade counters used to constitute the unit 5, the inputs D and C may receive pulses of the same polarity, or else may receive only pulses of opposite polarities in order to effect either the forward or the backward counting of the pulses received.

In the embodiment illustrated the decade counters are of the binary output type. In addition, their inputs D and C can receive pulses of the same polarity. For this reason the generator 4 is connected to the two inputs C and D respectively of the first decade counter $6_1$, by means of a diode $D_1$ the cathode of which is connected to the generator 4, and by means of a circuit containing a diode $D_2$ the anode of which is connected to the generator 4, and an inverter circuit 8 connected to the input D (this circuit being shown partly in broken lines). This arrangement is suitable in cases where it is sufficient to record and display the number of pulses emitted by the generator 4 so as to act automatically on the operation and progression of the machine when the amplitude of its movement has reached certain predetermined values for example to reverse the direction of travel at the ends of the cutting face.

This first part of the arrangement, which is known per se, counts forwards and backwards, in decimal notation, the pulses $Sc$ and $Sd$ emitted by the generator 4, which is equivalent to saying that when the first decade counter $6_1$ has counted 10 pulses in one direction or the other, it shifts by one unit in the upward or downward direction the number recorded by the second decade counter $6_2$, depending on whether the operation effected is a forward or backward count, and so on for the following decades, the number of pulses counted by the decade counters $6_1$ to $6_4$ and displayed by the display circuit 7 being the number of double-links of the chain which have meshed with the sprocket 3.

This number rapidly becomes very great and no longer means very much to an observer who wishes to locate the situation of the machine on the cutting face by simply reading the number displayed by the display units $7_1$ to $7_4$. For this reason it is advantageous to convert the number of pulses received by the first decade counter $6_1$ into a number of units of a different unit of measurement, such as for example the meter. Another possible unit of measurement is the section of a rigid conveyor, this unit providing the advantage of being very significant to the operator of the cutting machine, who knows the number of sections of the conveyor installed at the cutting face. He knows for example where the $n^{th}$ section of the conveyor is situated.

In the case, for example, of a chain having a pitch of 8.6 cm, the succession of two pulses will mean that the machine will have progressed 8.6 or 17.2 cm, depending on whether the pick-up detects the passing of a single link or a double link. In order to convert the number of pulses arriving at the forward-backward counter unit into a number representing a number of conveyor sections of 150 cm each, it would be necessary to count and display one section when the progression of the machine results from the passing of $150/17,2 = 8.72$ double-links in front of the pick-ups 1 and 2, or, what amounts to the same thing, to display 10 sections when 87.2 teeth have passed in front of the pick-ups 1 and 2, The second part of the arrangement, which will now be described, makes it possible to convert with great accuracy the number of pulses counted by the decade counter $6_1$ — representing the number of double-links — into a number of sections recorded by the decade counters $6_2 - 6_4$ and displayed by the corresponding display circuit $7_1 - 7_4$.

Two converters 9 and 10 convert the binary information supplied respectively by the decade counters $6_1$ and $6_2$ into decimal information, this information being available in each case on one of the 10 outputs of each of the converters 9 and 10. In a manner known per se, when the decade counter $6_1$ has recorded the numeral 9, for example, the converter 9 converts the binary information supplied by the decade counter $6_1$ into a single item of information which is available only at the 9 output of the converter, and so on for the other numerals recorded by the decade counters $6_1$ and $6_2$.

The 8 and 9 outputs of the converter 9 can be simultaneously connected to an OR circuit 13 by means of removable pins 11. All the outputs of the converter 10 are each connected by means of a decoupling diode 12 to one of the pins of the base 14 of a connector 15. All the pins of the plug-in part 16 of the connector 15 are connected together and connected to the input of an AND circuit 17, the other input of which is connected to the 1 output of the converter 9. The output of AND circuit 17 is connected to the OR circuit 13. The types of connection by pins 11 and by a connector 15 are equivalent and may be used in substitution for each other.

The circuit constituted by the converters 9 and 10, the OR circuit 13, the AND circuit 17, and the connections through the pin or pins 11 and the connector 15 constitute a linear connection matrix which controls the operation of a relaxation generator 18, the output of which is simultaneously connected to two AND circuits 19 and 20 which form part of a branching circuit 21 which also comprises a diode $D_3$ whose anode is connected to the common point of the diode $D_2$ and of the inverter 8, and a flip-flop 22 the two outputs of which are respectively connected to the AND circuit 19 and to the AND circuit 20.

The arrangement also includes an OR circuit 23 disposed between the diode $D_1$ and the input C and an OR circuit 24 disposed between the inverter 8 and the input D of the decade $6_1$, the output of the AND circuit 19 being connected to the OR circuit 23, and the output of the AND circuit 20 being connected to the OR circuit 24.

Hereinafter it will be assumed that the artificial counting base to be obtained is not very different from 8.7, that is to say is represented by a number with one decimal place ($n = 1$).

If the pulses supplied by the generator 4 were to correspond to tenths of a conveyor section, when the decade counter $6_2$ displays 10 sections, this would correspond to 100 pulses transmitted by the generator 4 and recorded by the decade counters $6_1$ and $6_2$. Actually, when the machine has passed through 10 sections, the generator 4 has emitted only 87 pulses.

The device shown in the connected state in FIG. 1, that is to say with a single pin 11 and three pins engaged on the connector 15, will produce 13 supplementary pulses before the generator 4 has supplied its 87th pulse and will transmit the latter to the input C or D in operation, in such a manner that the unit 5 has counted 100 pulses when the generator 4 has produced only 87 pulses. Each of the additional pulses is generated every time the unit 5 has recorded one of the number of a series of 13 numbers and figures selected in advance and shown in the list of numbers contained between 0.0 section and 10.0 section.

The circuit comprising the elements 9 to 24 functions in the following manner. If the 9 output of the converter 9 is actually connected to the OR circuit 13 by means of the pin 11, the generator 18 will supply a pulse every time the decade counter $6_1$ has recorded the numeral 9. If, the plug-in part 16 connects the AND circuit both to the 1 output of the converter 9 and to the outputs 1, 2 and 3 of the converter 10 by means of three pins of the connector 15, the relaxation generator 18 will supply a pulse every time the decade counters $6_1$ to $6_2$ will have recoreded the numbers 1.1, 1.2 and 1.3.

In this case, when the machine has passed through 10 sections, the unit 5 will have counted:

87 pulses originating from the generator 4, + 10 additional pulses which are supplied by the generator 18 and which caused the decade counters $6_1$ and $6_2$ to pass successively from 0.9 to 1.0. 1.9 to 2.0 . . . 9.9 to 10.0. + 3 pulses which are supplied by the generator 18 and which caused the decade counters $6_1$ and $6_2$ to pass successively from 1.1 to 1.2, 2.1 to 2.2, 3.1 to 3.2, that is to say making a total of the 100 pulses which it was desired to record.

It is clearly seen that the relaxation generator 18 supplies the pulses every time the unit 5 has recorded the 13 preselected numbers, and that this is done both when the unit 5 is counting forwards and when it is counting backwards. For this reason the pulses supplied by the generator 18 must be branched off to the input C or D actually in operation. The branching circuit 21 makes it possible to effect this operation in the following manner.

When the generator 4 supplies positive pulses which are to be applied to the forward counting input C of the unit 5, the state of the flip-flop 22 is such that it permanently enables the AND circuit 19 and permanently blocks the AND circuit 20. Consequently the additional pulses supplied by the generator 18 can be applied only to the input C by way of the AND circuit 19 and by way of the OR circuit 23. On the other hand, when the generator 4 supplies negative pulses corresponding to the opposite direction of progression of the machine and these have to be applied to the input D of the unit 5, these negative pulses are applied to the flip-flop by the diode $D_3$. The flip-flop changes state and blocks the AND circuit 19 and unblocks the AND circuit 20. It follows that each additional pulse supplied by the generator 18 can be applied only to the input D of the unit 5 by way of the AND circuit 20 of the OR circuit 24, as long as the period of the flip-flop is long in relation to the interval of time separating the moment when the counter recorded the pulse which triggered the operation of the generator 18 and the moment when the additional pulse is actually supplied by the generator 18.

It has been shown how an artificial counting base of 8.7 could be used with a decimal counter. The user will readily be able to employ any other artificial base by modifying the connections made at 11 and at 15, as appropriate.

FIG. 2 shows part of the diagram of a modified embodiment of the invention. The part now shown is identical to the corresponding part of FIG. 1, so that FIG. 2 should be read in conjunction with FIG. 1.

The device makes it possible to display a counting base and to trigger the operation of the relaxation generator 18 by the use of 4-digit binary comparators 25 and 26 of the types DM 7200 and DM 8200 supplied by the National Semiconductor Company. These comparators have four numerical inputs A1, A2, A3, A4, corresponding respectively to the binary weights 1-2-4-8 four comparison terminals B1, B2, B3, B4 corresponding respectively to the binary weights 1-2-4-8, and two output terminals X and Y. The comparison numeral B is displayed by connecting to earth a certain number of comparison terminals, the comparison numeral B displayed being represented by the combination of the binary weights of the comparison terminals which are not connected to earth. Depending on whether the binary numeral A applied to the input A1 to A4 is smaller than, equal to, or larger than the comparison numberal B displayed, the outputs X and Y each supply the digits 1 or 0 in accordance with the table shown in FIG. 3.

It will be assumed hereinbelow that the relaxation generator 18 must supply a pulse every time the decade counter $6_1$ has recorded the numeral 9 and every time the set of two decade counters $6_1$ and $6_2$ has recorded the numbers 7.1, 8.1 and 9.1, that is to say a total of the 13 numbers and numerals forming part of the list defined above.

Taking into account the instructions for use of the previously mentioned binary comparators, the following connections are made:

The binary outputs of the decade counter $6_1$ are connected to the input $A_1$ to $A_4$ of the first comparator 25 whose comparison terminals $B_1$, $B_2$, and $B_3$ are connected to earth, the comparison numerals displayed in the numeral 8; the output terminal Y of the comparator 25 is connected to one of the inputs of the AND circuit 27, while its output X is connected to the same AND circuit by means of an inverter circuit 28;

The binary outputs of the decade counter $6_2$ are connected to the input of the second comparator 26, whose comparison terminal $B_4$ is connected to earth and whoe output X is connected to one of the inputs of the AND circuits 29 by means of an inverter circuit 30, the comparison numeral displayed being the numeral 7;

The binary output of weight 1 of the decade counter $6_1$ is connected to the AND circuit 29 by means of an inverter circuit 21 and the outputs of weights 2, 4, 8 of the decade counter $6_1$ are directly connected to the AND circuit 29.

The triggering of the operation of the relaxation generator 18 can be effected only when the AND circuits 27 and 29 supply the same digit as is applied to the generator 18 either directly or by means of an inverter circuit 32, depending on the manner in which this operation is triggered.

Taking into account the constitution of the assembly comprising the elements 25 to 32 and the indications contained in the table in FIG. 3:

1. The output Y of the comparator 25 will supply the digit 0 to the AND circuit 27 and the output X will supply the digit 1, while the inverter circuit 28 will supply the digit 0 to the AND circuit 27 when the numeral supplied by the decade counter $6_1$ is higher than the comparison numeral 8 displayed, the AND circuit 27 then supplying the digit 0 to the inverter circuit 32;

2. In order that the AND circuit 29 may also supply the digit 0, it is necessary for all its inputs to receive the same digit 0, which can be achieved only when only the binary output of weight 1 of the decade counter $6_1$ is in the binary state 1 and when at the same time the output X of the comparator circuit 26 is in the binary state 1, which occurs when the figure supplied by the second decade counters $6_2$ is equal to or higher than the comparison numeral 7 displayed on the comparator 26.

All the other combinations of numerals supplied by the decade counters $6_1$ and $6_2$ cause the AND circuit 27 and 29 to supply digits which are different from 0. To sum up, the relaxation generator 18 is triggered by the circuit comprising the elements 25, 27 and 28 every time the decade counter $6_1$ has recorded the numeral 9, and is likewise triggered by the circuit comprising the elements 26, 29 and 30, 31 every time the decade counters $6_1$ and $6_2$ have recorded the numerals 7.1, 8.1 and 9.1.

The methods of internal connection of the arrangement according to the invention will depend on the type of counting circuits constituting the pulse counter 5, and also on the nature of any comparators used. It will also depend on the number $n$ of decimals which it is desired to retain for artificial counting base. Thus, if the artificial counting base comprises two decimals, the arrangement illustrated in FIG. 1 will be supplemented by a third binary-decimal converter associated with the decade counters $6_3$ and suitably coupled on the one hand to the other converters and, on the other hand, to the OR circuit 13. In the same way the device illlustrated in FIG. 2 can be supplemented by a third display binary comparator associated with a second AND circuit similar to the AND circuit 29 and suitably coupled to the output of the said third comparator and to the outputs of the decade counters $6_1$ and $6_2$. In a general way, in the case where the pulse counter 5 is a decimal counter and if $n$ is the number of decimals of the artificial counting base $b$ lower than 10, the pulse counter must contain at least $(n + 1)$ decades, and the linear connection matrix must utilize the first $(n + 1)$ decades, the number $n$ of additional pulses which have to be supplied by the generator 18 being equal to $N = 10^n + 1 - 10^n (10 - b)$.

It should be noted that the numeral indicated by the first decade counter does not correspond to a decimal fraction of the unit of measurement adopted for the other decade counters. As has been described, it can even be expressed by a different unit of measurement. For this reason its display is not necessary and even, in certain cases, it should not be displayed in order to avoid erroneous interpretations of the set of numerals displayed.

I claim:

1. An electrical device for numerical measurement of a quantity by a pulse counter with a fixed whole number counting base, each pulse representing a rational fraction of the unit of measurement of the quantity comprising a pulse counter including binary counting circuits, means for supplying to said pulse counter a supplementary pulse every time said pulse counter stands at one of the numerals of a preselected series of numerals, said pulse supplying means including a pulse generator connected to the input circuit of said pulse counter, a display comparator circuit controlling said pulse supplying means and connected to the output circuit of the pulse counter and including binary-decimal coders each of which is associated with one of said binary counting circuits, a decimal display system connected to outputs from said pulse counter, an AND circuit whose output is connected to said pulse generator, an OR circuit, means for connecting outputs of said coder associated with the first of said counting circuits to said OR circuit, said connecting means including at least one AND circuit whose output is permanently connected to said OR circuit, and means for connecting certain outputs of said coders to one of the inputs of each said AND circuit of said connecting means.

2. a device according to claim 1, for measurement in accordance with an artificial counting base $b$ and $n$ decimals, wherein said binary counting circuits in said pulse counter comprises at least $n + 1$ decade counters, the series of predetermined numbers consists of $N = 10^{n+1} - 10^n (10 - b)$ numerals of the list of $10^{n+1}$ numerals, and said comparator circuit comprises $n + 1$ of said binary decimal coders.

3. An electrical device for numerical measurement of a quantity by a pulse counter with a fixed whole number counting base, each pulse representing a rational fraction of the unit of measurement of the quantity comprising a pulse counter including binary counting circuits, means for supplying to said pulse counter a supplementary pulse every time said pulse counter stands at one of the numerals of a preselected series of numerals, said pulse supplying means including a pulse generator connected to the input circuit of said pulse counter, a display comparator circuit controlling said pulse supplying means and connected to the output circuit of the pulse counter and including display binary comparators each of which is associated with one of said counting circuits, AND circuits each of which is associated with one of said comparators associated with the counting circuits of the rank $2, 3, \ldots,$ and means for connecting each of said AND circuits simultaneously to the output of said comparator with which it is associated and to the outputs of all the counting circuits of lower rank, and for connecting to said pulse generator the outputs of said comparator associated with the first counting circuit and the outputs of several of said AND circuits so that said pulse generator will supply a pulse ever time the set of said counting circuits has recorded one of the numerals of a series selected by the user.

4. A device according to claim 3, for measurement in accordance with an artificial counting base $b$ of $n$ decimals, wherein said binary counting circuits in said pulse counter comprise at least $n + 1$ decade counters, the series of predetermined numbers consists of $N = 10^{n+1} - 10^n (10 - b)$ numerals of the list of $10^{n+1}$ numerals, and said comparator circuit comprises $n + 1$ of said display binary comparatos and $n$ of said AND circuits.

5. An electrical device for numerical measurement of a quantity by a pulse counter with a fixed whole number counting base, each pulse representing a rational fraction of the unit of measurement of the quantity comprising a pulse counter including at least two inputs operable as forward and backward pulse counting device, means for supplying to said pulse counter a supplementary pulse every time said pulse counter stands at one of the numerals of a preselected series of numerals, said pulse supplying means including a pulse generator, branching circuit means to direct supplementary pulses from said pulse generator to one of said inputs of said counter which is operable to receive the supplementary pulse, and a display comparator circuit controlling said pulse supplying means and connected to the output circuit of the pulse counter.

* * * * *